United States Patent
Jales

(10) Patent No.: US 10,454,425 B2
(45) Date of Patent: Oct. 22, 2019

(54) AUTOMATIC BIAS CONTROLLER FOR A PULSED POWER AMPLIFIER

(71) Applicant: FLIR Systems, Inc., Wilsonville, OR (US)

(72) Inventor: Richard Jales, Eastleigh (GB)

(73) Assignee: FLIR SYSTEMS, INC., Wilsonville, OR (US)

( * ) Notice: Subject to any disclaimer, the term of this patent is extended or adjusted under 35 U.S.C. 154(b) by 0 days.

(21) Appl. No.: 15/913,091

(22) Filed: Mar. 6, 2018

(65) Prior Publication Data

US 2018/0198414 A1 Jul. 12, 2018

Related U.S. Application Data

(63) Continuation of application No. PCT/US2016/050817, filed on Sep. 8, 2016.
(Continued)

(51) Int. Cl.
*H03F 3/04* (2006.01)
*H03F 1/02* (2006.01)
(Continued)

(52) U.S. Cl.
CPC ......... *H03F 1/0211* (2013.01); *H03F 1/0261* (2013.01); *H03F 1/30* (2013.01);
(Continued)

(58) Field of Classification Search
CPC ......... H03F 1/0211; H03F 1/0244; H03F 3/04
(Continued)

(56) References Cited

U.S. PATENT DOCUMENTS 5,426,641 A 6/1995 Afrashteh et al.
5,903,177 A 5/1999 Schwab et al.
(Continued)

FOREIGN PATENT DOCUMENTS

| EP | 2709271 | 3/2014 |
| GB | 2476035 | 6/2011 |
| JP | H10 111354 | 4/1998 |

OTHER PUBLICATIONS

Darwish et al., "Temperature Dependence of GaN HEMT Small Signal Parameters," International Journal of Microwave Science and Technology, Dec. 9, 2011, 4 Pages, vol. 2011, Article ID 945189, Hindawi Publishing Corporation.
(Continued)

*Primary Examiner* — Steven J Mottola
(74) *Attorney, Agent, or Firm* — Haynes and Boone, LLP

(57) ABSTRACT

Systems and methods for automatically controlling the bias in a pulsed power amplifier include components for measuring the current in an amplifier, comparing the measured value with the desired value, modifying the bias, and controlling the bias applied to the power amplifier. A measurement circuit converts the measured current to a voltage, and a comparator compares a measured voltage with a reference voltage to continuously indicate whether the amplifier current is less than a desired quiescent value. A circuit controls the level of the gate-bias (Vg) during a pulse, such as with a pulse width modulator. The measurement of the amplifier current is registered after the bias is enabled, but before the signal pulse. Drive control logic implements a control algorithm for adjusting the gate value in between pulses and in time to be used for the next pulse.

20 Claims, 6 Drawing Sheets

Related U.S. Application Data

(60) Provisional application No. 62/217,548, filed on Sep. 11, 2015.

(51) Int. Cl.
| | | |
|---|---|---|
| *H03F 1/30* | (2006.01) | |
| *H03F 3/189* | (2006.01) | |
| *H03F 3/19* | (2006.01) | |
| *H03F 3/21* | (2006.01) | |

(52) U.S. Cl.
CPC ............ *H03F 1/301* (2013.01); *H03F 3/189* (2013.01); *H03F 3/19* (2013.01); *H03F 3/21* (2013.01); *H03F 2200/15* (2013.01); *H03F 2200/18* (2013.01); *H03F 2200/27* (2013.01); *H03F 2200/351* (2013.01); *H03F 2200/451* (2013.01); *H03F 2200/462* (2013.01); *H03F 2200/78* (2013.01)

(58) Field of Classification Search
USPC .................................. 330/127, 285, 296, 297
See application file for complete search history.

(56) References Cited

U.S. PATENT DOCUMENTS

| | | |
|---|---|---|
| 6,566,944 B1 | 5/2003 | Pehlke et al. |
| 8,816,775 B2 * | 8/2014 | Annes ................... H03F 1/0288 330/296 |
| 2003/0137355 A1 | 7/2003 | Lin |
| 2003/0155978 A1 | 8/2003 | Pehlke |
| 2006/0192619 A1 | 8/2006 | Hoffmann et al. |

OTHER PUBLICATIONS

Liang et al., "Temperature dependence of GaAs metal-semiconductor field effect transistor threshold voltage," Journal of Vacuum Science & Technology B: Microelectronics Processing and Phenomena 6, Nov./Dec. 1988, pp. 1773-1778, American Vacuum Society.

Ni et al., "Temperature Dependence of InGaP/InGaAs/GaAs pHEMTs," CS MANTECH Conference, Apr. 24-27, 2006, pp. 247-250, Vancouver, British Columbia, Canada.

* cited by examiner

AUTOMATIC BIAS CONTROLLER FOR A PULSED POWER AMPLIFIER

CROSS-REFERENCE TO RELATED APPLICATIONS

This application is a continuation of International Patent Application No. PCT/US2016/050817 filed Sep. 8, 2016 and entitled "AUTOMATIC BIAS CONTROLLER FOR A PULSED POWER AMPLIFIER," which is incorporated herein by reference in its entirety.

International Patent Application No. PCT/US2016/050817 filed Sep. 8, 2016 and entitled "AUTOMATIC BIAS CONTROLLER FOR A PULSED POWER claims priority to and the benefit of U.S. Provisional Patent Application No. 62/217,548 filed Sep. 11, 2015 and entitled "AUTOMATIC BIAS CONTROLLER FOR A PULSED POWER AMPLIFIER," which is incorporated herein by reference in its entirety.

TECHNICAL FIELD

The present application relates generally to bias control circuitry for pulsed power amplifiers, and, more particularly, to bias point correction of pulsed power amplifiers used in remote sensing systems such as radar, sonar and electronic counter measure applications.

BACKGROUND

Remote sensing systems, such as radar, sonar, lidar, and/or other ranging sensory systems, are often used to assist in navigation by producing data and/or imagery of the environment surrounding a mobile structure, such as imagery representing above-surface and/or subsurface features critical to navigation of a watercraft over a body of water. In operation, a sensing system may calculate the distance to a target by measuring the time between a short burst of radio-frequency (RF) energy, transmitted as a series of pulses, and the return of a reflected echo.

The transmitted RF pulses are typically generated using a pulse amplifier. Generally, the operating bias point of an amplifier is set to a value that provides a compromise between efficiency and distortion. Various operating modes, with their corresponding bias points are described in literature for example Class A, B, C & D amplifiers. The class the amplifier operates in is largely determined by the DC quiescent (no applied signal) current in the amplifier.

In continuously operating amplifiers the signal current and bias current can be controlled by separating them in frequency. In pulsed amplifiers, for efficiency reasons, it is not desirable to apply the quiescent bias between pulses, as it wastes energy and heats up the device. As a result, the bias and operating signals are both pulses and the device currents are both fluctuating. There is a continued need for improved systems and methods for setting and correcting the bias point of pulsed power amplifiers.

SUMMARY

Systems and methods for controlling the bias in a pulsed power amplifier include, in various embodiments, a system for measuring the current in an amplifier, a comparison circuit that compares the measured value with the desired value, a circuit using an algorithm to determine how to modify the bias, and a circuit to control the bias. The current measurement circuit can use a current transformer to convert the measured current to a voltage. A comparator can compare the measured voltage with a reference voltage and the measurement circuit outputs a logic signal (ID_LOW) which continuously indicates whether the amplifier current is less than a desired quiescent value. A circuit may be provided for controlling the level of the gate-bias (Vg) during a pulse, such as a pulse width modulator (PA_PWM). A circuit may be provided for enabling and timing the gate pulse (BIAS_ON) to amplifier during the pulse and a circuit for registering if the signal ID_LOW was low or high at the measurement time. The measurement of the amplifier current may be registered after the bias is enabled, but before the signal pulse. PA Drive Control Logic implements a control algorithm for adjusting the value of PA_PWM. The change to PA_PWM may not be made during this pulse, but in between pulses and in time to be used for the next pulse.

In various embodiments an automatic bias control system includes a power amplifier having an associated quiescent current value, a measurement circuit configured to measure a current supplied to the power amplifier, a comparison circuit configured to compare the measured current to the quiescent current value, a bias controller coupled to the comparison circuit, the bias controller configured to adjust a bias using the comparison, and a bias control circuit for timing a gate pulse provided to the power amplifier. The measurement circuit may include a current transformer coupled to the power amplifier supply, the current transformer configured to convert the measured current to a measured voltage. The comparison circuit may include a reference signal generator providing a reference signal having the quiescent current value, and a comparator coupled to the measurement circuit to receive the measured voltage, wherein the comparator outputs a logic signal (ID_LOW) indicating whether a the measured voltage is less than the quiescent current value.

In some embodiments, the bias controller may comprise a pulse width modulator configured to produce a pulse width modulated signal (PA_PWM) for supply to the power amplifier, and a power amplifier drive control logic configured to adjust PA_PWM with reference to the value of ID_LOW. The power amplifier drive control logic may be further configured to increment PA_PWM by one if ID_LOW is true, and decrement PA_PWM by one if ID_LOW is false. In various embodiments, the system may further comprise a waveform generator providing a pulsed waveform signal to the power amplifier, and a transmitter configured to transmit the amplified pulsed waveform signal.

In various embodiments an automatic bias control method includes determining a quiescent current value of a power amplifier, measuring a current supplied to the power amplifier, comparing the measured current to the quiescent current value, and adjusting a bias of the power amplifier using the comparison. Adjusting the bias may further comprise controlling the bias applied to the power amplifier using a control circuit for timing a gate pulse provided to the power amplifier. Measuring may further comprise converting the measured current of a power amplifier supply to a measured voltage using a current transformer. Comparing may further comprise providing a reference signal having the quiescent current value, receiving the measured voltage, and setting a value of a logic signal (ID_LOW) to indicate whether a the measured voltage is less than the quiescent current value.

In various embodiments adjusting the bias may include producing a pulse width modulated signal (PA_PWM) for supply to the power amplifier, and adjusting PA_PWM based on the value of ID_LOW by incrementing PA_PWM by one if ID_LOW is true, decrementing PA_PWM by one if ID_LOW is false.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1A:
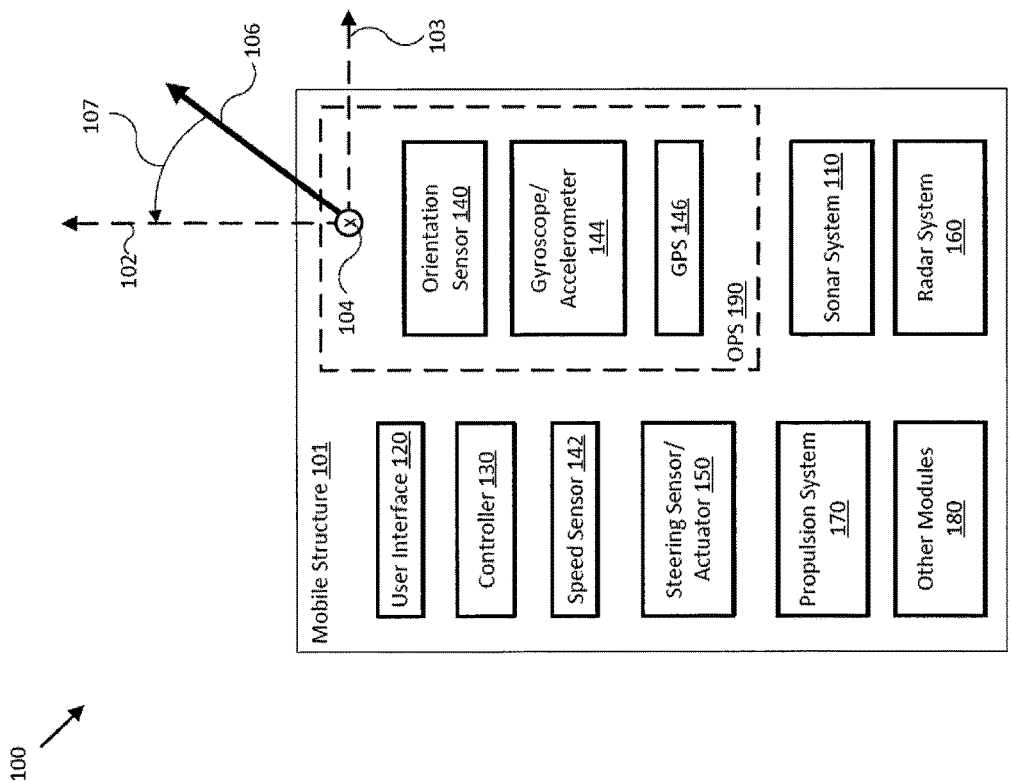
FIG. 1A illustrates a block diagram of a remote sensing system in accordance with an embodiment of the disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

In accordance with various embodiments of the present disclosure, systems and methods for controlling the bias of a pulsed power amplifier are provided. In one embodiment, a circuit in a remote sensing system is provided to separate the signal and operating currents in a pulse amplifier, and a closed-loop controller is provided to modify the bias, independent of the operating signal current. In various embodiments, an automatic bias controller as disclosed herein may be implemented in a remote sensing system (e.g., a radar and/or sonar system) including one or more remote sensing assemblies, orientation sensors, gyroscopes, accelerometers, position sensors, and/or speed sensors providing measurements of an orientation, a position, an acceleration, and/or a speed of the remote sensing assemblies and/or a coupled mobile structure. For example, the various sensors may be mounted to or within the mobile structure (e.g., a watercraft, aircraft, motor vehicle, and/or other mobile structure), or may be integrated with the remote sensing assemblies. Embodiments of the present disclosure are able to automatically set, and continuously correct, the bias point of a pulsed power amplifier, such as the pulsed power amplifiers used in radar and electronic counter measures (ECM) applications, for example.

As described herein, in various embodiments, the bias level may be set and then measured just before each pulse, and so the bias is enabled minimally longer than the pulse itself, and the amplifier can be substantially off (e.g., drawing little or no power) for the remainder of the operational time. Furthermore, the bias level can be measured just prior to a first pulse and changed accordingly for a subsequent pulse, such that the bias level can continuously adapt to changes to the electrical response of the circuit, for example due to temperature. As a result of this type of bias control, the duration for which the power amplifier is biased, and therefore dissipating power, is minimized, and the speed of response required of the bias circuitry to keep the bias at the required level (e.g., to retain a consistent, reliable, and repeatable pulse amplification output by the pulse amplifier) is minimized, which can reduce the implementation cost of bias circuitry and increase overall operational reliability of the bias circuity. Because the pulse amplifier is kept substantially off except when required to amplify a pulse according to a precise bias level, embodiments considerably reduce dissipation within, and overall power consumption of, a coupled pulsed amplifier, which permits lower cost and/or more compact (e.g., less effective at removing heat) amplifier packaging to be used. Furthermore, due to the precise timing of the bias level control, amplification of noise occurring outside the pulse period is minimized, which helps to reduce interference and/or other noise related artifacts that may be received by a corresponding pulse receiver and/or be otherwise included in corresponding return signals and/or resulting sensor data.

FIG. 1A illustrates a block diagram of remote sensing system 100 in accordance with an embodiment of the disclosure. In various embodiments, system 100 may be adapted to measure an orientation, a position, an acceleration, and/or a speed of sonar system 110, radar system 160, user interface 120, and/or mobile structure 101 using any of the various sensors of orientation and/or position sensors (OPS) 190 and/or system 101. System 100 may then use these measurements to form various views of sonar data provided by sonar system 110 and/or radar data provided by radar system 160, adjust an orientation of the sonar system 110 or radar system 160, and/or otherwise use the measurements according to a desired operation of system 100 and/or mobile structure 101. In some embodiments, system 100 may display resulting imagery to a user through user interface 120, and/or use the sonar data, radar data, orientation and/or sensor data, and/or imagery to control operation of mobile structure 101, such as controlling steering actuator 150 and/or propulsion system 170 to steer mobile structure 101 according to a desired heading, such as heading angle 107, for example.

In the embodiment shown in FIG. 1A, system 100 may be implemented to provide remote sensing data and/or imagery for a particular type of mobile structure 101, such as a drone, a watercraft, an aircraft, a robot, a vehicle, and/or other types of mobile structures, including any platform designed to move through or under the water, through the air, and/or on a terrestrial surface. In one embodiment, the OPS 190 includes an orientation sensor 140, a gyroscope/accelerometer 144, and/or a global positioning satellite system (GPS) 146). The various embodiments, the system 100 may also include a speed sensor 142 and one or more other sensors and/or actuators, such as other modules 180. In some embodiments, one or more of the elements of system 100 may be implemented in a combined housing or structure that can be coupled to mobile structure 101 and/or held or carried by a user of mobile structure 101.

Directions 102, 103, and 104 describe one possible coordinate frame of mobile structure 101 (e.g., for headings or orientations measured by orientation sensor 140 and/or angular velocities and accelerations measured by gyroscope 144 and accelerometer 145). As shown in FIG. 1A, direction 102 illustrates a direction that may be substantially parallel to and/or aligned with a longitudinal axis of mobile structure 101, direction 103 illustrates a direction that may be substantially parallel to and/or aligned with a lateral axis of mobile structure 101, and direction 104 illustrates a direction that may be substantially parallel to and/or aligned with a vertical axis of mobile structure 101, as described herein. For example, a roll component of motion of mobile structure 101 may correspond to rotations around direction 102, a pitch component may correspond to rotations around direction 103, and a yaw component may correspond to rotations around direction 104.

Heading angle 107 may correspond to the angle between a projection of a reference direction 106 (e.g., the local component of the Earth's magnetic field) onto a horizontal plane (e.g., referenced to a gravitationally defined "down" vector local to mobile structure 101) and a projection of direction 102 onto the same horizontal plane. In some embodiments, the projection of reference direction 106 onto a horizontal plane (e.g., referenced to a gravitationally defined "down" vector) may be referred to as Magnetic North. In various embodiments, Magnetic North, True North, a "down" vector, and/or various other directions, positions, and/or fixed or relative reference frames may define an absolute coordinate frame, for example, where directional measurements referenced to an absolute coordinate frame may be referred to as absolute directional measurements (e.g., an "absolute" orientation). In some embodiments, directional measurements may initially be referenced to a coordinate frame of a particular sensor (e.g., a sonar transducer assembly or other module of sonar system 110, OPS 190, orientation sensor 140, and/or user interface 120, for example) and be transformed (e.g., using parameters for one or more coordinate frame transformations) to be referenced to an absolute coordinate frame and/or a coordinate frame of mobile structure 101. In various embodiments, an absolute coordinate frame may be defined and/or correspond to a coordinate frame with one or more undefined axes, such as a horizontal plane local to mobile structure 101 and referenced to a local gravitational vector but with an unreferenced and/or undefined yaw reference (e.g., no reference to Magnetic North).

Sonar system 110 may be implemented as one or more electrically and/or mechanically coupled controllers, transmitters, receivers, transceivers, signal processing logic devices, various electrical components, transducer elements of various shapes and sizes, multichannel transducers/transducer modules, transducer assemblies, assembly brackets, transom brackets, and/or various actuators adapted to adjust orientations of any of the components of sonar system 110, as described herein. In various embodiments, sonar system 110 may be configured according to various sonar system arrangements (e.g., remote sensing system arrangements) that can be used to detect objects within a water column and/or a floor of a body of water. More generally, sonar system 110 may be configured to emit one, multiple, or a series of acoustic beams (e.g., remote sensor beams), receive corresponding acoustic returns (e.g., remote sensor returns), and convert the acoustic returns into sonar data and/or imagery (e.g., remote sensor image data), such as bathymetric data, water depth, water temperature, water column/volume debris, bottom profile, and/or other types of sonar data. Sonar system 110 may be configured to provide such data and/or imagery to user interface 120 for display to a user, for example, or to controller 130 for additional processing.

In some embodiments, sonar system 110 may be implemented using a compact design, where multiple sonar transducers, sensors, and/or associated processing devices are located within a single transducer assembly housing that is configured to interface with the rest of system 100 through a single cable providing both power and communications to and from sonar system 110. In some embodiments, sonar system 110 may include orientation and/or position sensors configured to help provide two or three dimensional waypoints, increase sonar data and/or imagery quality, and/or provide highly accurate bathymetry data, as described herein.

For example, in the context of sea based sonar, fisherman desire highly detailed and accurate information and/or imagery of underwater structure and mid water targets (e.g., fish). Conventional sonar systems can be expensive and bulky and typically cannot be used to provide relatively accurate and/or distortion free underwater views, as described herein. Embodiments of sonar system 110 include low cost single, dual, and/or multichannel sonar systems that can be configured to produce detailed two and three dimensional sonar data and/or imagery. In some embodiments, sonar system 110 may consolidate electronics and transducers into a single waterproof package to reduce size and costs, for example, and may be implemented with a single connection to other devices of system 100 (e.g., via an Ethernet cable with power over Ethernet, an integral power cable, and/or other communication and/or power transmission conduits integrated into a single interface cable).

In various embodiments, sonar system 110 may be configured to provide many different display views from a variety of selectable perspectives, including down imaging, side imaging, and/or three dimensional imaging, using a selection of configurations and/or processing methods, as described herein. In some embodiments, sonar system 110 may be implemented with a single transducer assembly housing incorporating one or two transducers and/or associated electronics. In other embodiments, sonar system 110 may be implemented with a transducer assembly housing incorporating a multichannel transducer and/or associated electronics. In such embodiments, sonar system 110 may be configured to transmit acoustic beams using a transmission channel and/or element of a multichannel transducer (which may include an automatic bias controlled pulse amplifier as disclosed herein), receive acoustic returns using multiple receive channels and/or elements of the multichannel transducer, and to perform beamforming and/or interferometry processing on the acoustic returns to produce two and/or three dimensional sonar imagery. In some embodiments, one or more sonar transmitters of sonar system 110 may be configured to use CHIRP transmissions to improve range resolution and hence reduce ambiguities typically inherent in interferometry processing techniques.

In various embodiments, sonar system 110 may be implemented with its own dedicated OPS 190, which may include various orientation and/or position sensors (e.g., similar to orientation sensor 140, gyroscope/accelerometer 144, and/or GPS 146) that may be incorporated within the transducer assembly housing to provide three dimensional orientations and/or positions of the transducer assembly and/or transducer(s) for use when processing or post processing sonar data for display. The sensor information can be used to correct for movement of the transducer assembly between ensonifications to provide improved alignment of corresponding acoustic returns/samples, for example, and/or to generate imagery based on the measured orientations and/or positions of the transducer assembly. In other embodiments, an external orientation and/or position sensor can be used alone or in combination with an integrated sensor or sensors.

In embodiments where sonar system 110 is implemented with a position sensor, sonar system 110 may be configured to provide a variety of sonar data and/or imagery enhancements. For example, sonar system 110 may be configured to provide accurate positioning of sonar data and/or user-defined waypoints remote from mobile system 101. Similarly, sonar system 110 may be configured to provide accurate two and/or three dimensional aggregation and/or display of a series of sonar data; without position data, a sonar system typically assumes a straight track, which can cause image artifacts and/or other inaccuracies in corresponding sonar data and/or imagery. Additionally, when implemented with a position sensor and/or interfaced with a remote but relatively fixed position sensor (e.g., GPS 146), sonar system 110 may be configured to generate accurate and detailed bathymetric views of a floor of a body of water.

In embodiments where sonar system 110 is implemented with an orientation and/or position sensor, sonar system 110 may be configured to store such location/position information along with other sensor information (acoustic returns, temperature measurements, text descriptions, water depth, altitude, mobile structure speed, and/or other sensor and/or control information) available to system 100. In some embodiments, controller 130 may be configured to generate a look up table so that a user can select desired configurations of sonar system 110 for a particular location or to coordinate with some other sensor information. Alternatively, an automated adjustment algorithm can be used to select optimum configurations based on the sensor information.

For example, in one embodiment, mobile structure 101 may be located in an area identified on an chart using position data, a user may have selected a user setting for a configuration of sonar system 110, and controller 130 may be configured to control an actuator and/or otherwise implement the configuration for sonar system 110 (e.g., to set a particular orientation). In still another embodiment, controller 130 may be configured to receive orientation measurements for mobile structure 101. In such embodiment, controller 130 may be configured to control the actuators associated with the transducer assembly to maintain its orientation relative to, for example, the mobile structure and/or the water surface, and thus improve the displayed sonar images (e.g., by ensuring consistently oriented acoustic beams and/or proper registration of a series of acoustic returns). In various embodiments, controller 130 may be configured to control steering sensor/actuator 150 and/or propulsion system 170 to adjust a position and/or orientation of mobile structure 101 to help ensure proper registration of a series of acoustic returns, sonar data, and/or sonar imagery.

Although FIG. 1A shows various sensors and/or other components of system 100 separate from sonar system 110, in other embodiments, any one or combination of sensors and components of system 100 may be integrated with a sonar assembly, an actuator, a transducer module, and/or other components of sonar system 110. For example, OPS 190 may be integrated with a transducer module of sonar system 110 and be configured to provide measurements of an absolute and/or relative orientation (e.g., a roll, pitch, and/or yaw) of the transducer module to controller 130 and/or user interface 120, both of which may also be integrated with sonar system 110.

Radar system 160 may be implemented as one or more electrically and/or mechanically coupled controllers, transmitters, receivers, transceivers, signal processing logic devices, various electrical components, antenna elements of various shapes and sizes, multichannel antennas/antenna modules, radar assemblies, assembly brackets, mast brackets, automatic bias controlled pulse powered amplifiers (as disclosed herein) and/or various actuators adapted to adjust orientations of any of the components of radar system 160, as described herein. For example, in various embodiments, radar system 160 may be implemented according to various radar system arrangements (e.g., remote sensing system arrangements) that can be used to detect features of and objects on or above a terrestrial surface or a surface of a body of water.

More generally, radar system 160 may be configured to emit one, multiple, or a series of radar beams (e.g., remote sensor beams), receive corresponding radar returns (e.g., remote sensor returns), and convert the radar returns into radar data and/or imagery (e.g., remote sensor image data), such as one or more intensity plots and/or aggregation of intensity plots indicating a relative position, orientation, and/or other characteristics of structures, weather phenomena, waves, other mobile structures, surface boundaries, and/or other objects reflecting the radar beams back at radar system 160. Radar system 160 may be configured to provide such data and/or imagery to user interface 120 for display to a user, for example, or to controller 130 for additional processing. Moreover, such data may be used to generate one or more charts corresponding to MS data, ARPA data, MARPA data, and or one or more other target tracking and/or identification protocols.

In some embodiments, radar system 160 may be implemented using a compact design, where multiple radar antennas, sensors, and/or associated processing devices are located within a single radar assembly housing that is configured to interface with the rest of system 100 through a single cable providing both power and communications to and from radar system 160. In some embodiments, radar system 160 may include orientation and/or position sensors (e.g., OPS 190) configured to help provide two or three dimensional waypoints, increase radar data and/or imagery quality, and/or provide highly accurate radar image data, as described herein. For example, fishermen desire highly detailed and accurate information and/or imagery of local and remote structures and other watercraft. Embodiments of radar system 160 may include low cost single, dual, and/or multichannel (e.g., synthetic aperture) radar systems that can be configured to produce detailed two and three dimensional radar data and/or imagery. In some embodiments, radar system 160 may consolidate electronics and transducers into a single waterproof package to reduce size and costs, for example, and may be implemented with a single connection to other devices of system 100 (e.g., via an Ethernet cable with power over Ethernet, an integral power cable, and/or other communication and/or power transmission conduits integrated into a single interface cable).

In various embodiments, radar system 160 may be implemented with its own dedicated OPS 190, which may include various orientation and/or position sensors (e.g., similar to orientation sensor 140, gyroscope/accelerometer 144, and/or GPS 146) that may be incorporated within the radar assembly housing to provide three dimensional orientations and/or positions of the radar assembly and/or antenna(s) for use when processing or post processing radar data for display. The sensor information can be used to correct for movement of the radar assembly between beam emissions to provide improved alignment of corresponding radar returns/samples, for example, and/or to generate imagery based on the measured orientations and/or positions of the radar assembly/antenna. In other embodiments, an external orientation and/or position sensor can be used alone or in combination with an integrated sensor or sensors.

In embodiments where radar system 160 is implemented with a position sensor, radar system 160 may be configured to provide a variety of radar data and/or imagery enhancements. For example, radar system 160 may be configured to provide accurate positioning of radar data and/or user-defined waypoints remote from mobile system 101. Similarly, radar system 160 may be configured to provide accurate two and/or three dimensional aggregation and/or display of a series of radar data; without either orientation data or position data to help determine a track or heading, a radar system typically assumes a straight track, which can cause image artifacts and/or other inaccuracies in corresponding radar data and/or imagery. Additionally, when implemented with a position sensor, radar system 160 may be configured to generate accurate and detailed intensity plots of objects on a surface of a body of water without access to a magnetometer.

In embodiments where radar system 160 is implemented with an orientation and/or position sensor, radar system 160 may be configured to store such location/position information along with other sensor information (radar returns, temperature measurements, text descriptions, altitude, mobile structure speed, and/or other sensor and/or control information) available to system 100. In some embodiments, controller 130 may be configured to generate a look up table so that a user can select desired configurations of radar system 160 for a particular location or to coordinate with some other sensor information. Alternatively, an automated adjustment algorithm can be used to select optimum configurations based on the sensor information.

In one embodiment, mobile structure 101 may be located in an area identified on an chart using position data, a user may have selected a user setting for a configuration of radar system 160, and controller 130 may be configured to control an actuator and/or otherwise implement the configuration for radar system 160 (e.g., to set a particular orientation or rotation rate). In still another embodiment, controller 130 may be configured to receive orientation measurements for mobile structure 101. In such embodiment, controller 130 may be configured to control the actuators associated with the radar assembly to maintain its orientation relative to, for example, the mobile structure and/or the water surface, and thus improve the displayed sonar images (e.g., by ensuring consistently oriented radar beams and/or proper registration of a series of radar returns). In various embodiments, controller 130 may be configured to control steering sensor/actuator 150 and/or propulsion system 170 to adjust a position and/or orientation of mobile structure 101 to help ensure proper registration of a series of radar returns, radar data, and/or radar imagery.

Although FIG. 1A shows various sensors and/or other components of system 100 separate from radar system 160, in other embodiments, any one or combination of sensors and components of system 100 may be integrated with a radar assembly, an actuator, a transducer module, and/or other components of radar system 160. For example, OPS 190 may be integrated with an antenna platform of sonar system 110 and be configured to provide measurements of an absolute and/or relative orientation (e.g., a roll, pitch, and/or yaw) of the antenna to controller 130 and/or user interface 120, both of which may also be integrated with radar system 160.

User interface 120 may be implemented as a display, a touch screen, a keyboard, a mouse, a joystick, a knob, a steering wheel, a ship's wheel or helm, a yoke, and/or any other device capable of accepting user input and/or providing feedback to a user. In various embodiments, user interface 120 may be adapted to provide user input (e.g., as a type of signal and/or sensor information) to other devices of system 100, such as controller 130. User interface 120 may also be implemented with one or more logic devices that may be adapted to execute instructions, such as software instructions, implementing any of the various processes and/or methods described herein. For example, user interface 120 may be adapted to form communication links, transmit and/or receive communications (e.g., sensor signals, control signals, sensor information, user input, and/or other information), determine various coordinate frames and/or orientations, determine parameters for one or more coordinate frame transformations, and/or perform coordinate frame transformations, for example, or to perform various other processes and/or methods.

In various embodiments, user interface 120 may be adapted to accept user input, for example, to form a communication link, to select a particular wireless networking protocol and/or parameters for a particular wireless networking protocol and/or wireless link (e.g., a password, an encryption key, a MAC address, a device identification number, a device operation profile, parameters for operation of a device, and/or other parameters), to select a method of processing sensor signals to determine sensor information, to adjust a position and/or orientation of an articulated sensor, and/or to otherwise facilitate operation of system 100 and devices within system 100. Once user interface 120 accepts a user input, the user input may be transmitted to other devices of system 100 over one or more communication links.

In one embodiment, user interface 120 may be adapted to receive a sensor or control signal (e.g., from orientation sensor 140 and/or steering sensor/actuator 150) over communication links formed by one or more associated logic devices, for example, and display sensor and/or other information corresponding to the received sensor or control signal to a user. In related embodiments, user interface 120 may be adapted to process sensor and/or control signals to determine sensor and/or other information. For example, a sensor signal may include an orientation, an angular velocity, an acceleration, a speed, and/or a position of mobile structure 101. In such embodiment, user interface 120 may be adapted to process the sensor signals to determine sensor information indicating an estimated and/or absolute roll, pitch, and/or yaw (attitude and/or rate), and/or a position or series of positions of sonar system 110, radar system 160, and/or mobile structure 101, for example, and display the sensor information as feedback to a user. In one embodiment, user interface 120 may be adapted to display a time series of various sensor information and/or other parameters as part of or overlaid on a graph or map, which may be referenced to a position and/or orientation of mobile structure 101. For example, user interface 120 may be adapted to display a time series of positions, headings, and/or orientations of mobile structure 101 and/or other elements of system 100 (e.g., a transducer assembly and/or module of sonar system 110, or an antenna or radar assembly of radar system 160) overlaid on a geographical map, which may include one or more graphs indicating a corresponding time series of actuator control signals, sensor information, and/or other sensor and/or control signals, including sonar and/or radar image data.

In some embodiments, user interface 120 may be adapted to accept user input including a user-defined target heading, route (e.g., track for radar system 160), and/or orientation for a transducer module, for example, and to generate control signals for steering sensor/actuator 150 and/or propulsion system 170 to cause mobile structure 101 to move according to the second heading, route, and/or orientation. In further embodiments, user interface 120 may be adapted to accept user input including a user-defined target attitude/absolute angular frequency for an actuated device (e.g., sonar system 110, radar system 160) coupled to mobile structure 101, for example, and to generate control signals for adjusting an orientation or rotation of the actuated device according to the target attitude/angular frequency. More generally, user interface 120 may be adapted to display sensor information to a user, for example, and/or to transmit sensor information and/or user input to other user interfaces, sensors, or controllers of system 100, for instance, for display and/or further processing. In one embodiment, user interface 120 may be integrated with one or more sensors (e.g., imaging modules, position and/or orientation sensors, other sensors) and/or be portable (e.g., such as a portable touch display or smart phone, for example, or a wearable user interface) to facilitate user interaction with various systems of mobile structure 101.

Controller 130 may be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of sonar system 110, radar system 160, steering sensor/actuator 150, mobile structure 101, and/or system 100, for example. Such software instructions may also implement methods for processing sensor signals, determining sensor information, providing user feedback (e.g., through user interface 120), querying devices for operational parameters, selecting operational parameters for devices, or performing any of the various operations described herein (e.g., operations performed by logic devices of various devices of system 100).

In addition, a machine readable medium may be provided for storing non-transitory instructions for loading into and execution by controller 130. In these and other embodiments, controller 130 may be implemented with other components where appropriate, such as volatile memory, non-volatile memory, one or more interfaces, and/or various analog and/or digital components for interfacing with devices of system 100. For example, controller 130 may be adapted to store sensor signals, sensor information, parameters for coordinate frame transformations, calibration parameters, sets of calibration points, and/or other operational parameters, over time, for example, and provide such stored data to a user using user interface 120. In some embodiments, controller 130 may be integrated with one or more user interfaces (e.g., user interface 120), and, in one embodiment, may share a communication module or modules. As noted herein, controller 130 may be adapted to execute one or more control loops for actuated device control, steering control (e.g., using steering sensor/actuator 150) and/or performing other various operations of mobile structure 101 and/or system 100. In some embodiments, a control loop may include processing sensor signals and/or sensor information in order to control one or more operations of sonar system 110, radar system 160, mobile structure 101, and/or system 100.

OPS 190 may be implemented as an integrated selection of orientation and/or position sensors (e.g., orientation sensor 140, accelerometer/gyroscope 144, GPS 146) that is configured to provide orientation and/or position data in relation to one or more elements of system 100. For example, embodiments of OPS 190 may be integrated with mobile structure 101, sonar system 110, and/or radar system 160 and be configured to provide orientation and/or position data corresponding to a center of mass of mobile structure 101, a sonar transducer of sonar system 110, and/or a radar antenna of radar system 160. Such measurements may be referenced to an absolute coordinate frame, for example, or may be referenced to a coordinate frame of OPS 190 and/or any one of the individual sensors integrated with OPS 190. More generally, OPS 190 provides a single, relatively compact integrated device that can be replicated throughout various elements of system 100, which in some embodiments may include a single/simplified interface for data and/or power. In various embodiments, the coordinate frames for one or more of the orientation and/or position sensors integrated into OPS 190 may be referenced to each other (e.g., to a single coordinate frame for OPS 190), such as at time of manufacture, to reduce or eliminate a need to determine coordinate frame transformations to combine data from multiple sensors of OPS 190 during operation of system 100.

Orientation sensor 140 may be implemented as one or more of a compass, float, accelerometer, magnetometer, and/or other digital or analog device capable of measuring an orientation of mobile structure 101 (e.g., magnitude and direction of roll, pitch, and/or yaw, relative to one or more reference orientations such as gravity and/or Magnetic North) and providing such measurements as sensor signals that may be communicated to various devices of system 100. In some embodiments, orientation sensor 140 may be adapted to provide heading measurements for mobile structure 101. In other embodiments, orientation sensor 140 may be adapted to provide roll, pitch, and/or yaw rates for mobile structure 101 (e.g., using a time series of orientation measurements). Orientation sensor 140 may be positioned and/or adapted to make orientation measurements in relation to a particular coordinate frame of mobile structure 101, for example.

Speed sensor 142 may be implemented as an electronic pitot tube, metered gear or wheel, water speed sensor, wind speed sensor, a wind velocity sensor (e.g., direction and magnitude) and/or other device capable of measuring or determining a linear speed of mobile structure 101 (e.g., in a surrounding medium and/or aligned with a longitudinal axis of mobile structure 101) and providing such measurements as sensor signals that may be communicated to various devices of system 100. In some embodiments, speed sensor 142 may be adapted to provide a velocity of a surrounding medium relative to sensor 142 and/or mobile structure 101.

Gyroscope/accelerometer 144 may be implemented as one or more electronic sextants, semiconductor devices, integrated chips, accelerometer sensors, accelerometer sensor systems, or other devices capable of measuring angular velocities/accelerations and/or linear accelerations (e.g., direction and magnitude) of mobile structure 101 and providing such measurements as sensor signals that may be communicated to other devices of system 100 (e.g., user interface 120, controller 130). Gyroscope/accelerometer 144 may be positioned and/or adapted to make such measurements in relation to a particular coordinate frame of mobile structure 101, for example. In various embodiments, gyroscope/accelerometer 144 may be implemented in a common housing and/or module to ensure a common reference frame or a known transformation between reference frames.

GPS 146 may be implemented as a global positioning satellite receiver and/or other device capable of determining absolute and/or relative position of mobile structure 101 (e.g., or an element of mobile structure 101, such as sonar system 110 radar system 160, and/or user interface 120) based on wireless signals received from space-born and/or terrestrial sources, for example, and capable of providing such measurements as sensor signals that may be communicated to various devices of system 100. More generally, GPS 146 may be implemented to any one or combination of a number of different GNSSs. In some embodiments, GPS 146 may be used to determine a velocity, speed, COG, SOG, track, and/or yaw rate of mobile structure 101 (e.g., using a time series of position measurements), such as an absolute velocity and/or a yaw component of an angular velocity of mobile structure 101. In various embodiments, one or more logic devices of system 100 may be adapted to determine a calculated speed of mobile structure 101 and/or a computed yaw component of the angular velocity from such sensor information.

Steering sensor/actuator 150 may be adapted to physically adjust a heading of mobile structure 101 according to one or more control signals, user inputs, and/or stabilized attitude estimates provided by a logic device of system 100, such as controller 130. Steering sensor/actuator 150 may include one or more actuators and control surfaces (e.g., a rudder or other type of steering or trim mechanism) of mobile structure 101, and may be adapted to physically adjust the control surfaces to a variety of positive and/or negative steering angles/positions.

Propulsion system 170 may be implemented as a propeller, turbine, or other thrust-based propulsion system, a mechanical wheeled and/or tracked propulsion system, a sail-based propulsion system, and/or other types of propulsion systems that can be used to provide motive force to mobile structure 101. In some embodiments, propulsion system 170 may be non-articulated, for example, such that the direction of motive force and/or thrust generated by propulsion system 170 is fixed relative to a coordinate frame of mobile structure 101. Non-limiting examples of non-articulated propulsion systems include, for example, an inboard motor for a watercraft with a fixed thrust vector, for example, or a fixed aircraft propeller or turbine. In other embodiments, propulsion system 170 may be articulated, for example, and may be coupled to and/or integrated with steering sensor/actuator 150, for example, such that the direction of generated motive force and/or thrust is variable relative to a coordinate frame of mobile structure 101. Non-limiting examples of articulated propulsion systems include, for example, an outboard motor for a watercraft, an inboard motor for a watercraft with a variable thrust vector/port (e.g., used to steer the watercraft), a sail, or an aircraft propeller or turbine with a variable thrust vector, for example.

Other modules 180 may include other and/or additional sensors, actuators, communications modules/nodes, and/or user interface devices used to provide additional environmental information of mobile structure 101, for example. In some embodiments, other modules 180 may include a humidity sensor, a wind and/or water temperature sensor, a barometer, a radar system, a visible spectrum camera, an infrared camera, and/or other environmental sensors providing measurements and/or other sensor signals that can be displayed to a user and/or used by other devices of system 100 (e.g., controller 130) to provide operational control of mobile structure 101 and/or system 100 that compensates for environmental conditions, such as wind speed and/or direction, swell speed, amplitude, and/or direction, and/or an object in a path of mobile structure 101, for example.

In other embodiments, other modules 180 may include one or more actuated devices (e.g., spotlights, infrared illuminators, cameras, radars, sonars, and/or other actuated devices) coupled to mobile structure 101, where each actuated device includes one or more actuators adapted to adjust an orientation of the device, relative to mobile structure 101, in response to one or more control signals (e.g., provided by controller 130). Other modules 180 may include a sensing element angle sensor, for example, which may be physically coupled to a radar assembly housing of radar system 160 and be configured to measure an angle between an orientation of an antenna/sensing element and a longitudinal axis of the housing and/or mobile structure 101. Other modules 180 may also include a rotating antenna platform and/or corresponding platform actuator for radar system 160. In some embodiments, other modules 180 may include one or more Helmholtz coils integrated with OPS 190, for example, and be configured to selectively cancel out one or more components of the Earth's magnetic field.

In general, each of the elements of system 100 may be implemented with any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a method for providing sonar data and/or imagery, for example, or for transmitting and/or receiving communications, such as sensor signals, sensor information, and/or control signals, between one or more devices of system 100. In one embodiment, such method may include instructions to receive an orientation, acceleration, position, and/or speed of mobile structure 101 and/or sonar system 110 from various sensors, to determine a transducer orientation adjustment (e.g., relative to a desired transducer orientation) from the sensor signals, and/or to control an actuator to adjust a transducer orientation accordingly, for example, as described herein. In a further embodiment, such method may include instructions for forming one or more communication links between various devices of system 100.

In addition, one or more machine readable mediums may be provided for storing non-transitory instructions for loading into and execution by any logic device implemented with one or more of the devices of system 100. In these and other embodiments, the logic devices may be implemented with other components where appropriate, such as volatile memory, non-volatile memory, and/or one or more interfaces (e.g., inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces, such as an interface for one or more antennas, or an interface for a particular type of sensor).

Each of the elements of system 100 may be implemented with one or more amplifiers, modulators, phase adjusters, beamforming components, digital to analog converters (DACs), analog to digital converters (ADCs), various interfaces, antennas, transducers, and/or other analog and/or digital components enabling each of the devices of system 100 to transmit and/or receive signals, for example, in order to facilitate wired and/or wireless communications between one or more devices of system 100. Such components may be integrated with a corresponding element of system 100, for example. In some embodiments, the same or similar components may be used to perform one or more sensor measurements, as described herein.

For example, the same or similar components may be used to create an acoustic pulse (e.g., a transmission control signal and/or a digital shaping control signal), convert the acoustic pulse to an excitation signal (e.g., a shaped or unshaped transmission signal) and transmit it to a sonar transducer element to produce an acoustic beam, receive an acoustic return (e.g., a sound wave received by the sonar transducer element and/or corresponding electrical signals from the sonar transducer element), convert the acoustic return to acoustic return data, and/or store sensor information, configuration data, and/or other data corresponding to operation of a sonar system, as described herein. Similarly, the same or similar components may be used to create a radar pulse (e.g., a transmission control signal and/or a digital shaping control signal), convert the radar pulse to an excitation signal (e.g., a shaped or unshaped transmission signal) and transmit it to a radar antenna to produce a radar beam, receive a radar return (e.g., an electromagnetic wave received by the radar antenna and/or corresponding electrical signals from the radar antenna), convert the radar return to radar return data, and/or store sensor information, configuration data, and/or other data corresponding to operation of a radar system, as described herein.

Sensor signals, control signals, and other signals may be communicated among elements of system 100 using a variety of wired and/or wireless communication techniques, including voltage signaling, Ethernet, WiFi, Bluetooth, Zigbee, Xbee, Micronet, or other medium and/or short range wired and/or wireless networking protocols and/or implementations, for example. In such embodiments, each element of system 100 may include one or more modules supporting wired, wireless, and/or a combination of wired and wireless communication techniques.

In some embodiments, various elements or portions of elements of system 100 may be integrated with each other, for example, or may be integrated onto a single printed circuit board (PCB) to reduce system complexity, manufacturing costs, power requirements, and/or timing errors between the various sensor measurements. For example, gyroscope/accelerometer 144, user interface 120, and controller 130 may be configured to share one or more components, such as a memory, a logic device, a communications module, and/or other components, and such sharing may act to reduce and/or substantially eliminate such timing errors while reducing overall system complexity and/or cost.

Each element of system 100 may include one or more batteries or other electrical power storage devices, for example, and may include one or more solar cells or other electrical power generating devices (e.g., a wind or water-powered turbine, or a generator producing electrical power from motion of one or more elements of system 100). In some embodiments, one or more of the devices may be powered by a power source for mobile structure 101, using one or more power leads. Such power leads may also be used to support one or more communication techniques between elements of system 100.

In various embodiments, a logic device of system 100 (e.g., of orientation sensor 140 and/or other elements of system 100) may be adapted to determine parameters (e.g., using signals from various devices of system 100) for transforming a coordinate frame of sonar system 110 and/or other sensors of system 100 to/from a coordinate frame of mobile structure 101, at-rest and/or in-motion, and/or other coordinate frames, as described herein. One or more logic devices of system 100 may be adapted to use such parameters to transform a coordinate frame of sonar system 110, radar system 160, and/or other sensors of system 100 to/from a coordinate frame of orientation sensor 140 and/or mobile structure 101, for example. Furthermore, such parameters may be used to determine and/or calculate one or more adjustments to an orientation of sonar system 110 and/or radar system 160 that would be necessary to physically align a coordinate frame of sonar system 110 and/or radar system 160 with a coordinate frame of orientation sensor 140 and/or mobile structure 101, for example, or an absolute coordinate frame. Adjustments determined from such parameters may be used to selectively power adjustment servos/actuators (e.g., of sonar system 110, radar system 160, and/or other sensors or elements of system 100), for example, or may be communicated to a user through user interface 120, as described herein.

Figure 1B:
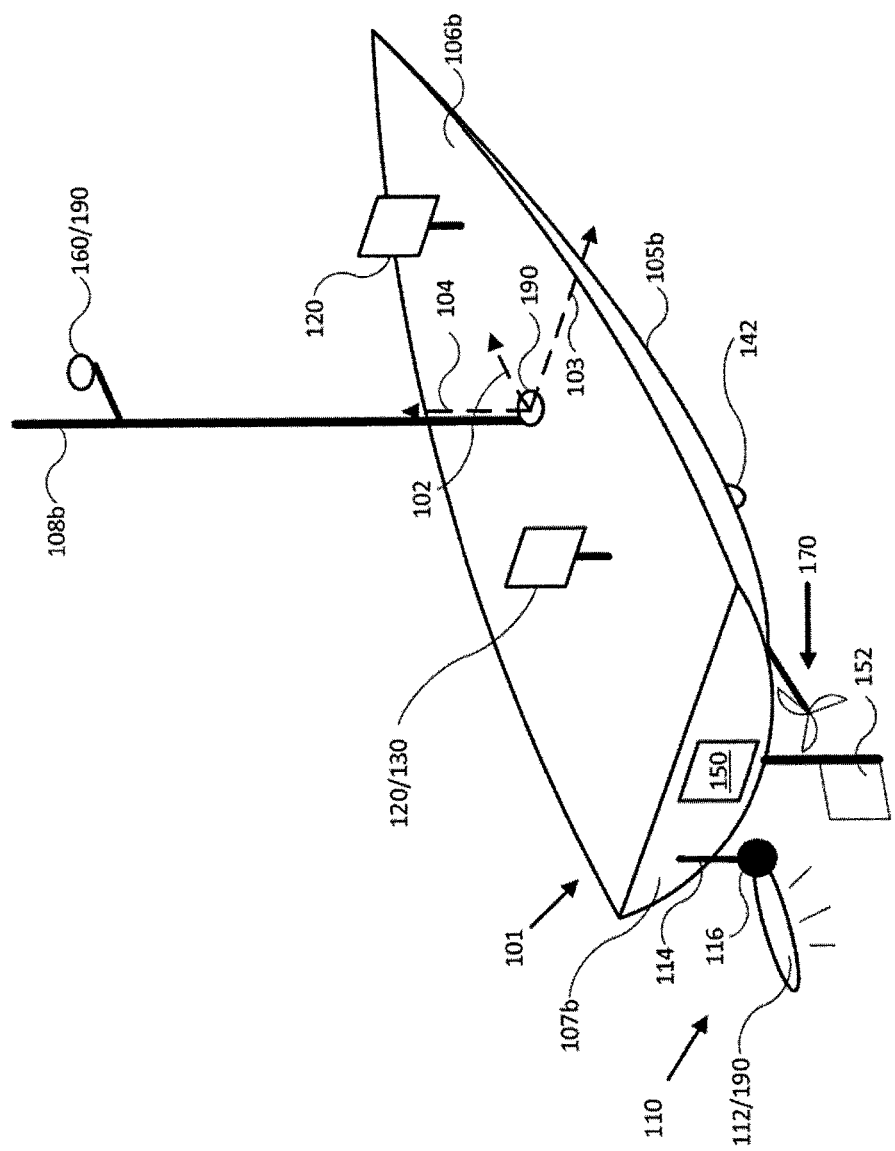
FIG. 1B illustrates a diagram of a remote sending system in accordance with an embodiment of the disclosure.

FIG. 1B illustrates a diagram of system 100B in accordance with an embodiment of the disclosure. In the embodiment shown in FIG. 1B, system 100B may be implemented to provide sonar and/or radar data and/or imagery for use with operation of mobile structure 101, similar to system 100 of FIG. 1A. For example, system 100B may include sonar system/OPS 110/190, radar system/OPS 160/190, integrated user interface/controller 120/130, secondary user interface 120, steering sensor/actuator 150, sensor cluster/OPS 190 (e.g., orientation sensor 140, gyroscope/accelerometer 144, and/or GPS 146), and various other sensors and/or actuators. In the embodiment illustrated by FIG. 1B, mobile structure 101 is implemented as a motorized boat including a hull 105*b*, a deck 106*b*, a transom 107*b*, radar system/OPS 160/190 coupled to mast/sensor mount 108*b*, a rudder 152, an inboard motor 170, and an actuated sonar system 110 coupled to transom 107*b*. In other embodiments, hull 105*b*, deck 106*b*, mast/sensor mount 108*b*, rudder 152, inboard motor 170, and various actuated devices may correspond to attributes of a passenger aircraft or other type of vehicle, robot, or drone, for example, such as an undercarriage, a passenger compartment, an engine/engine compartment, a trunk, a roof, a steering mechanism, a headlight, a radar system, and/or other portions of a vehicle.

As depicted in FIG. 1B, mobile structure 101 includes actuated sonar system 110, which in turn includes OPS 190 integrated with transducer assembly 112, which are coupled to transom 107*b* of mobile structure 101 through assembly bracket/actuator 116 and transom bracket/electrical conduit 114. In some embodiments, assembly bracket/actuator 116 may be implemented as a roll, pitch, and/or yaw actuator, for example, and may be adapted to adjust an orientation of transducer assembly 112 according to control signals and/or an orientation (e.g., roll, pitch, and/or yaw) or position of mobile structure 101 provided by user interface/controller 120/130. For example, user interface/controller 120/130 may be adapted to receive an orientation of transducer assembly 112 configured to ensonify a portion of surrounding water and/or a direction referenced to an absolute coordinate frame, and to adjust an orientation of transducer assembly 112 to retain ensonification of the position and/or direction in response to motion of mobile structure 101, using one or more orientations and/or positions of mobile structure 101 and/or other sensor information derived by executing various methods described herein.

In another embodiment, user interface/controller 120/130 may be configured to adjust an orientation of transducer assembly 112 to direct sonar transmissions from transducer assembly 112 substantially downwards and/or along an underwater track during motion of mobile structure 101. In such embodiment, the underwater track may be predetermined, for example, or may be determined based on criteria parameters, such as a minimum allowable depth, a maximum ensonified depth, a bathymetric route, and/or other criteria parameters. Transducer assembly 112 may be implemented with a sonar position and/or orientation sensor (SPOS), which may include one or more sensors corresponding to orientation sensor 140, gyroscope/accelerometer 144 and/or GPS 146, for example, that is configured to provide absolute and/or relative positions and/or orientations of transducer assembly 112 to facilitate actuated orientation of transducer assembly 112.

Also shown in FIG. 1B is radar system 160, which includes integrated OPS 190 and a radar antenna platform and actuator configured to rotate the radar antenna about a vertical axis substantially aligned with vertical axis 104 of mobile structure 101. In some embodiments, user interface/controller 120/130 may be configured to receive radar returns from a radar assembly of radar system/OPS 160/190, and corresponding orientation and/or position data from radar system/OPS 160/190 (e.g., corresponding to an orientation and/or position of an antenna of radar system 160 when the radar returns are received), and then generate radar image data based, at least in part, on the radar returns and the corresponding orientation and/or position data.

More generally, both sonar system 110 and radar system 160 are types of remote sensing systems, each with remote sensing assemblies (e.g., sonar assemblies, radar assemblies) including housings adapted to be mounted to mobile structure 101, each with OPS disposed within their respective housings and adapted to measure an orientation and/or position of an associated sensing element (e.g., sonar transducer, radar antenna), and each having access to or integrated with a logic device (e.g., controller 130) configured to receive remote sensor returns from the corresponding remote sensing assembly and sensor return orientation and/or position data from the corresponding OPS and generate remote sensor image data based, at least in part, on the remote sensor returns and the sensor return orientation and/or position data. Once the remote sensor image data is received, user interface/controller 120/130 may be configured to render the remote sensor image data on a display of any one of user interface 120, for example. In some embodiments, multiple sets of remote sensor image data may be displayed on the same user interface using one or more geo-referenced, target references, and/or source references overlays.

In one embodiment, user interfaces 120 may be mounted to mobile structure 101 substantially on deck 106b and/or mast/sensor mount 108b. Such mounts may be fixed, for example, or may include gimbals and other leveling mechanisms/actuators so that a display of user interfaces 120 can stay substantially level with respect to a horizon and/or a "down" vector (e.g., to mimic typical user head motion/orientation), for example, or so the display can be oriented according to a user's desired view. In another embodiment, at least one of user interfaces 120 may be located in proximity to mobile structure 101 and be mobile/portable throughout a user level (e.g., deck 106b) of mobile structure 101. For example, a secondary user interface 120 may be implemented with a lanyard, strap, headband, and/or other type of user attachment device and be physically coupled to a user of mobile structure 101 so as to be in proximity to the user and mobile structure 101. In various embodiments, user interfaces 120 may be implemented with a relatively thin display that is integrated into a PCB of the corresponding user interface in order to reduce size, weight, housing complexity, and/or manufacturing costs.

As shown in FIG. 1B, in some embodiments, speed sensor 142 may be mounted to a portion of mobile structure 101, such as to hull 105b, and be adapted to measure a relative water speed. In some embodiments, speed sensor 142 may be adapted to provide a thin profile to reduce and/or avoid water drag. In various embodiments, speed sensor 142 may be mounted to a portion of mobile structure 101 that is substantially outside easy operational accessibility. Speed sensor 142 may include one or more batteries and/or other electrical power storage devices, for example, and may include one or more water-powered turbines to generate electrical power. In other embodiments, speed sensor 142 may be powered by a power source for mobile structure 101, for example, using one or more power leads penetrating hull 105b. In alternative embodiments, speed sensor 142 may be implemented as a wind velocity sensor, for example, and may be mounted to mast/sensor mount 108b to have relatively clear access to local wind.

In the embodiment illustrated by FIG. 1B, mobile structure 101 includes direction/longitudinal axis 102, direction/lateral axis 103, and direction/vertical axis 104 meeting approximately at mast/sensor mount 108b (e.g., near a center of gravity of mobile structure 101). In one embodiment, the various axes may define a coordinate frame of mobile structure 101 and/or sensor cluster 160.

Each sensor adapted to measure a direction (e.g., velocities, accelerations, headings, or other states including a directional component) may be implemented with a mount, actuators, and/or servos that can be used to align a coordinate frame of the sensor with a coordinate frame of any element of system 100B and/or mobile structure 101. Each element of system 100B may be located at positions different from those depicted in FIG. 1B. Each device of system 100B may include one or more batteries or other electrical power storage devices, for example, and may include one or more solar cells or other electrical power generating devices. In some embodiments, one or more of the devices may be powered by a power source for mobile structure 101. As noted herein, each element of system 100B may be implemented with an antenna, a logic device, and/or other analog and/or digital components enabling that element to provide, receive, and process sensor signals and interface or communicate with one or more devices of system 100B. Further, a logic device of that element may be adapted to perform any of the methods described herein.

Figure 2:
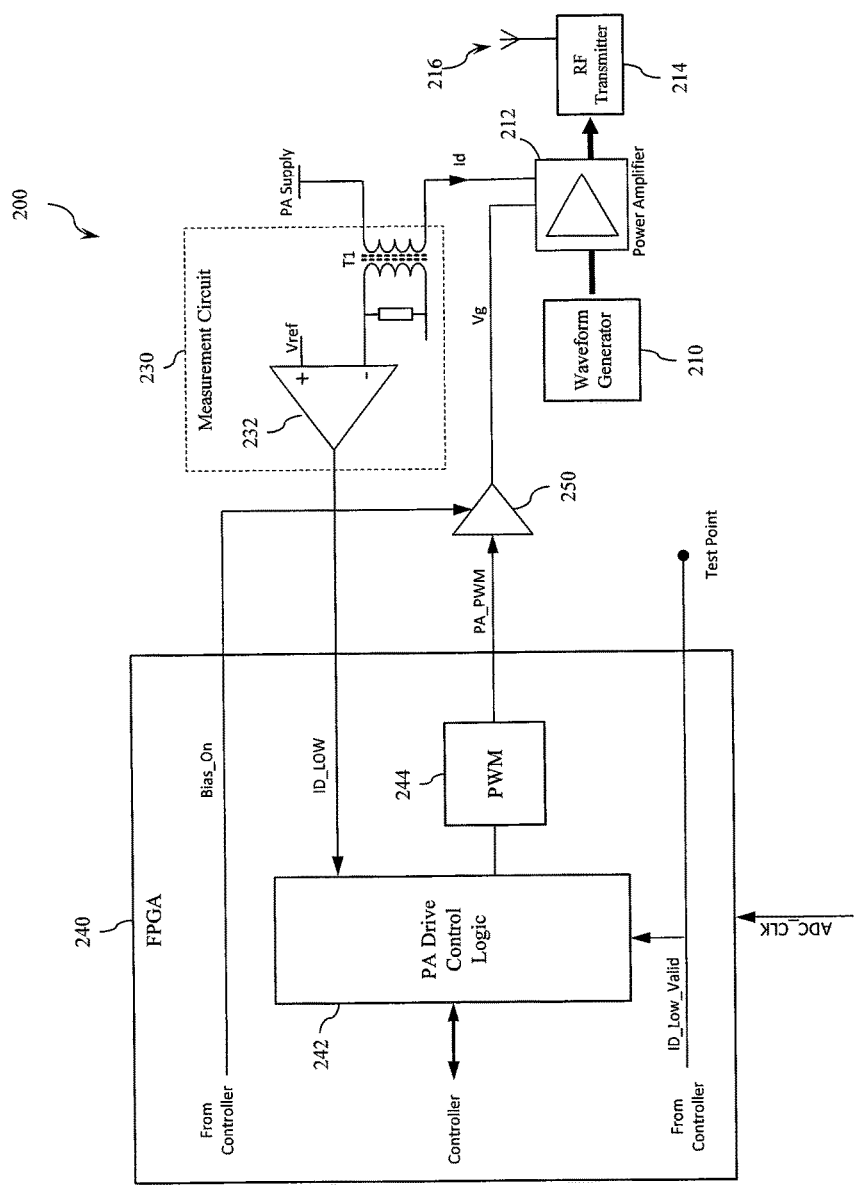
FIG. 2 illustrates an embodiment of bias control circuitry for a power amplifier.

FIG. 2 illustrates an embodiment of bias control circuitry for a pulsed power amplifier of a remote sensing system 200. As shown in FIG. 2, remote sensing system 200 may include a waveform generator 210, a power amplifier 212, a radio frequency transmitter 214 including an antenna 216, a measurement circuit 230, and a control circuitry 240. The various components of remote sensing system 200 may be implemented by one or more of the components or circuit boards of system 100 identified in FIGS. 1A and 1B, such as sonar system 110 or radar system 160.

Waveform generator 210 provides various waveforms, such as pulses of various lengths (e.g., different pulse widths) which may be transmitted (e.g., as radar signals) by antenna 216. For example, long and short pulse waveforms may be generated for long range target detection. In various embodiments, waveform generator 210 may generate other types of pulses, and other waveform types. For example, in various embodiments frequency-modulated continuous-wave radar (FMCW) signals (e.g., linear frequency varying signals also referred to as chirp signals) may be generated by the waveform generator 210 for short range target detection. Such FMCW signals may be implemented, for example, as rising, falling, or rising/falling frequency sweeps (e.g., up chirps, down chirps, or up/down chirps).

In various embodiments, waveform generator 210 may include a reference signal generator (e.g., a crystal oscillator) that generates a reference signal (e.g., a 10 MHz reference signal), a direct digital synthesizer (DDS) and a phase locked loop (PLL) circuit. The DDS may be configured to provide a baseband signal (e.g., in the form of I and Q signals) having a frequency deviation and pulse length that may be varied with a range setting of remote sensing system 200 in response to a control signal. In one embodiment, the DDS may be implemented by an FPGA (e.g., FPGA 240) and digital to analog converters.

In various embodiments, the waveform generator may include a PLL circuit operating with an oscillator (e.g., running at 9.36 GHz in one embodiment) to provide a local oscillator (LO) signal (e.g., a microwave X-band signal such as a 9.36 GHz signal) based on the reference signal and a control signal. In one embodiment, an upconverter may translate the baseband signal to the X-band frequency range to provide an upconverted signal. The upconverted signal may be an X-band signal within the maritime radar microwave signal range of 9.3 GHz to 9.5 GHz. In one embodiment, the upconverter may be implemented as an I/Q upconverter (e.g., a single sideband mixer) to help comply with International Telecommunication Union (ITU) spectrum emission standards, or other standards.

In various embodiments, the DDS may be used to provide pulse waveforms in the baseband signal (e.g., during pulse mode operation) and the PLL circuit and oscillator may be used to provide FMCW waveforms (e.g., during FMCW mode operation) or a substantially fixed frequency.

The upconverted signal may be amplified by one or more amplifiers, including power amplifier 212, to produce the remote sensing signal, such as a sonar or radar signal. In one embodiment, a variable gain amplifier is included to define and control the rise and fall times of transmitted signal pulses to reduce range side lobes and to limit the transmitted spectrum profile to comply with ITS spectrum emission standards or other standards.

In one embodiment, the power amplifier 212 may include one or more drivers which may be implemented by one or more GaN-based field effect transistors (FETs) in one or more stages to provide compact and efficient amplification based on one or more control signals, including bias control signals. In one embodiment, power amplifier 212 may be implemented as a two or three stage GaN device on a ceramic substrate with a matching circuit. In one embodiment, power amplifier 212 may be implemented using multiple integrated circuits (e.g., a multiple chip module) using a GaN high electron mobility transistor (HEMT) die with GaN and/or GaAs drivers. In one embodiment, power amplifier 212 may be configured to operate over the marine radar transmission band of 9.3 GHz to 9.5 GHz, with a nominal peak output of 20 Watts or greater and over 20 dB of gain from an input level of +15 dBm.

In one embodiment, drain (ID) and gate (Vg) bias current for the power amplifier 212 may be switched in response to control signals and in sympathy with (e.g., in relation to or synchronous with to some extent) the waveforms provided by waveform generator 210 such that power amplifier 212 is off (e.g., exhibits minimum gain and maximum isolation) when no waveforms for remote sensor signals are desired to be transmitted (e.g., to prevent carrier signal leakage from overloading receive components of radar system 160 when no desired signal is present).

In one embodiment, power amplifier 212 and various other components of the remote sensing system 200 may be implemented as low power surface mount components (e.g., with connection terminals co-planar to the underside of the components to permit automated assembly, rather than using a drop-in package style, flange mounting, or chips with wire bonding). In this regard, the underside of such components may provide ground and heat sink surfaces suitable for solder attachment to one or more PCBs and to dissipate heat to such PCBs.

In some embodiments, measurement circuit 230 includes a current transformer (T1) coupled to the power amplifier supply (PA Supply) to convert the measured current to a voltage. A comparator 232 compares the measured voltage with a reference voltage (Vref). In operation, the comparator 232 outputs a logic signal (ID_LOW) which indicates whether the PA Supply current is less than a reference voltage (Vref).

In one embodiment, the control circuitry 240 includes a field-programmable gate array (FPGA), which includes power amplifier drive control logic 242 and a pulse width modulator (PWM) 244 for controlling the level of the gate-bias (Vg) during a pulse, such as the output of the pulse width modulator 244 (PA_PWM). The control circuitry may also include circuitry for registering whether the signal ID_LOW is low or high at the measurement time. In other embodiments, the control circuitry 240 may be implemented as any appropriate logic device (e.g., processing device, microcontroller, processor, application specific integrated circuit (ASIC), memory storage device, memory reader, or other device or combinations of devices) that may be adapted to execute, store, and/or receive appropriate instructions, such as software instructions implementing a control loop for controlling various operations described herein.

Control circuitry 240 includes various interfaces to a system processor, such as controller 130 illustrated in FIG. 1A. Control circuitry 240 may be configured to provide the status of the drive controller to the higher-level control system via an interface to the system processor (e.g., an AMM Register Interface). For example, typical amplifier data might specify the quiescent current as the operating conditions Idq1=50~70 mA, and the bias level to achieve this might be −2.0 Volts.

In operation, the measurement circuit 230 measures the current in the power amplifier 212 and compares the measured voltage with a reference voltage. The measurement circuit outputs the logic signal (ID_LOW) which indicates whether the amplifier current is less than the required value. The control circuitry 240 determines how to modify the bias in response to the measured value. A circuit 250, which receives the PWM 244 output signal PA_PWM, is enabled by the logic signal BIAS_ON to control the level of the gate bias (Vg) during a pulse.

It will be appreciated that additional circuitry may be provided within the described system, such as a digital to analog converter applying the signal to the power amplifier 212, separate from the bias control. In the embodiment illustrated in FIG. 2, the bias controller is relatively low cost, and various components and signals (e.g., Bias_On, ID_Low and ID_Low_Valid) are single bit. In various embodiments, the bias controller does not require use of multi-level digital-to-analog converters or analog-to-digital converters.

Figure 3:
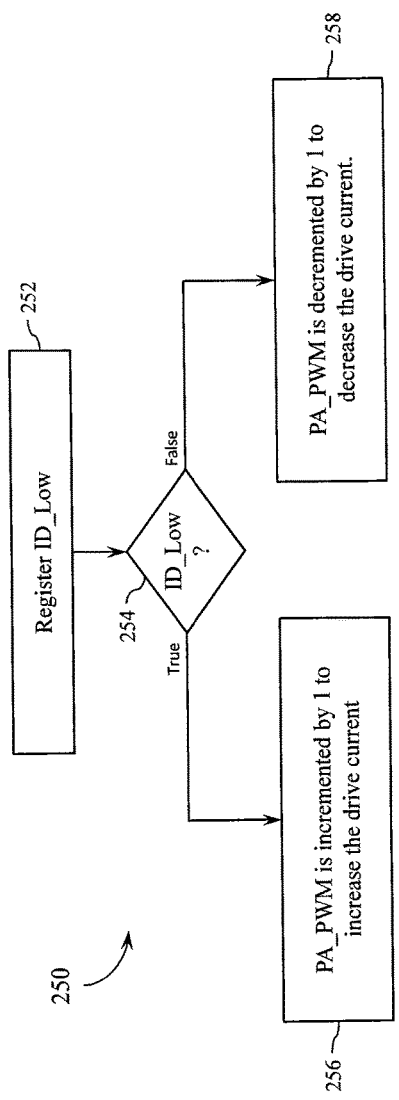
FIG. 3 is a flow diagram illustrating control logic in accordance with an embodiment of the disclosure.

In one embodiment, the measurement of the amplifier current is registered after the bias is enabled, but before the signal pulse. The Power Amplifier Drive Control Logic 242 implements a control algorithm, an embodiment of which is illustrated as algorithm 250 in FIG. 3. In the illustrated embodiment, ID_LOW is registered in step 252. If ID_LOW is true (step 254) at the time of registration, then PA_PWM is incremented by one in step 256 to increase the drive current. If ID_LOW is false (step 504) at the time of registration, then PA_PWM is decremented by 1 in step 258 to decrease the drive current. In this embodiment, the value of PA_PWM is not changed during the current pulse, but in between pulses and in time for use with the next pulse.

Accordingly, various embodiments of the present disclosure may be configured to provide precise timing and amplitude/level control for a bias signal that can be used to control operation of a power amplifier. Such bias signals may reduce the overall power dissipation and usage by a coupled power amplifier, which can allow for increased pulse rate and/or duration, over conventional systems, without risking thermal excursion and/or damage to the power amplifier. At the same time, such bias signals can help the power amplifier produce reliable and/or repeatable pulse amplitudes by automatically accounting for changes to the electrical response to the circuit, such as changes due to thermal variability while the system is in operation. In embodiments where the system is integrated with a ranging sensor system, such as a radar system, resulting sensor data can be more precise, due to the reliable pulse amplitudes, in addition to being relatively free from interference outside the duration of a pulse that would otherwise be amplified by the power amplifier and potentially propagated throughout the sensor system. Moreover, by providing such refined control of the on-time and output of the amplifier, lower cost and/or more compact amplifiers and/or amplifier packaging techniques.

Figure 4:
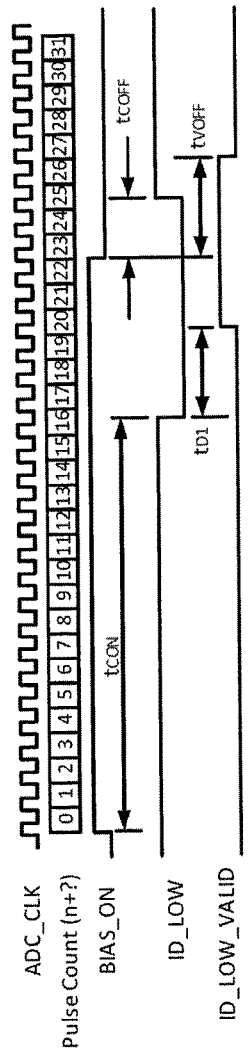
FIG. 4 is an embodiment of a timing diagram for signals in the embodiment of FIG. 2.

Referring to FIG. 4, a timing diagram illustrates an embodiment of the timing delays in the operation of certain embodiments of a bias controller described herein. ID_LOW can be sensed when the power amplifier 212 is on as well as the earliest time BIAS_ON can go low again and when ID_LOW can be sensed when the power amplifier 212 is off.

Figure 5:
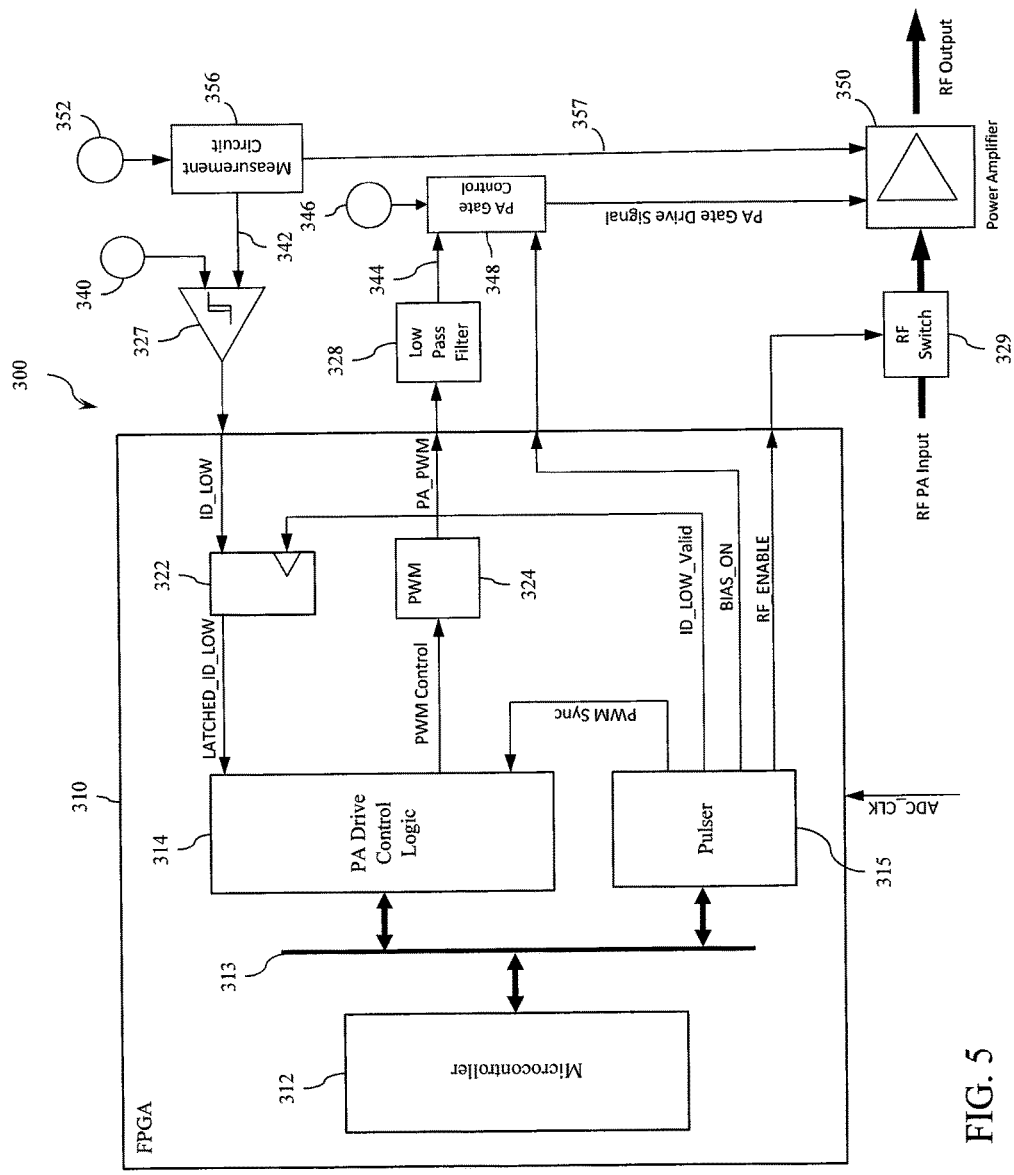
FIG. 5 is another embodiment of a bias control circuitry for a power amplifier.

Another embodiment of a remote sensing system using a bias controller of the present disclosure is illustrated in FIG. 5. A remote sensing system 300 includes digital circuitry 310 and analog circuit components including a voltage comparator 327, a low pass filter 328, an RF switch 329, a power amplifier gate control circuit 348, a power amplifier 350 and a measurement circuit 356. The various components of remote sensing system 300 may be implemented by one or more of the components or circuit boards of system 100 identified in FIGS. 1A and 1B, such as sonar system 110 or radar system 160, and may include similar components as found in the embodiment of FIG. 2.

In the illustrated embodiment, the power amplifier 350 receives radio frequency signals from the RF switch 329 and produces an amplified RF signal for transmission by radio frequency output components of the remote sensing system 300 (e.g., as radar signals). The RF switch 329 is controlled by an RF_ENABLE control signal generated by the digital circuitry 310.

In one embodiment, the measurement circuit 356 is coupled to a power amplifier drain supply 352 and coupled to the power amplifier 350 through power amplifier drain connection 357. The measurement circuit 356 detects the power from the power amplifier drain supply 352 and outputs a power amplifier drive current measurement signal 342, which is provided to a voltage comparator 327. The voltage comparator 327 compares the power amplifier drive current measurement signal 342 against the power amplifier 350's quiescent voltage level, which is set by power amplifier quiescent drive threshold 340, which provides the reference voltage (Vref) to the to the voltage comparator 327. The voltage comparator 327 compares the reference voltage to the power amplifier drive current measurement signal 342 and outputs a logic signal 323 (ID_LOW) to the digital circuitry 310, indicating whether the power amplifier drive current measurement signal 342 is less than the power amplifier quiescent voltage level.

In one embodiment, digital circuitry 310 includes is a field-programmable gate array (FPGA), which may include a microcontroller 312, a power amplifier (PA) drive control logic 314, a programmable pulse sequence generator (Pulser) 315, a latch circuit 322 and a pulse width modulator 244. Microcontroller 312 provides general system control for the digital circuitry 310. In alternative embodiments, microcontroller 312 may be provided as a component that is external to digital circuitry/FPGA 310. Power amplifier drive control logic 314 and Pulser 315 may be connected to microcontroller 312 via a data and control bus 313. In one embodiment, certain logic and control signals that control RF switch 329, PA drive control logic 314, PA Gate Control circuit 348 and/or latch circuit 322 are provided by Pulser 315.

In various embodiments, digital circuitry 310 may be implemented as any appropriate logic device (e.g., processing device, microcontroller, processor, application specific integrated circuit (ASIC), memory storage device, memory reader, or other device or combinations of devices) that may be adapted to execute, store, and/or receive appropriate instructions, such as software instructions implementing a control loop for controlling various operations described herein.

As illustrated, latch circuit 322 receives the ID_LOW signal from the voltage comparator 327 and an ID_LOW_VALID logic signal from Pulser 315, and latch circuit 322 outputs a LATCHED_ID_LOW signal which is registered by PA drive control logic 314. Power amplifier drive control logic 314 uses the registered LATCHED_ID_LOW and pulse modulation control time synchronization signal (PWM Sync) to control PWM 324 and adjust the pulse width modulated output signal (PA_PWM). In one embodiment, PA drive control logic 314 includes logic executed by microcontroller 312 for implementing the control logic described in the embodiment of FIG. 3 using the registered LATCHED_ID_LOW signal.

In various embodiments, PWM 324 outputs a Pulse Width Modulated output signal (PA_PWM) to low pass filter 328, which produces PA gate voltage control 344, which sets the quiescent drain current for power amplifier 350. Power amplifier gate control 348 is coupled to PA gate power supply 346 and receives the PA gate control voltage 344 to generate a PA gate drive signal which is provided to power amplifier 350. PA gate control 348 may be enabled by Bias_On signal received from the Pulser.

Figure 6:
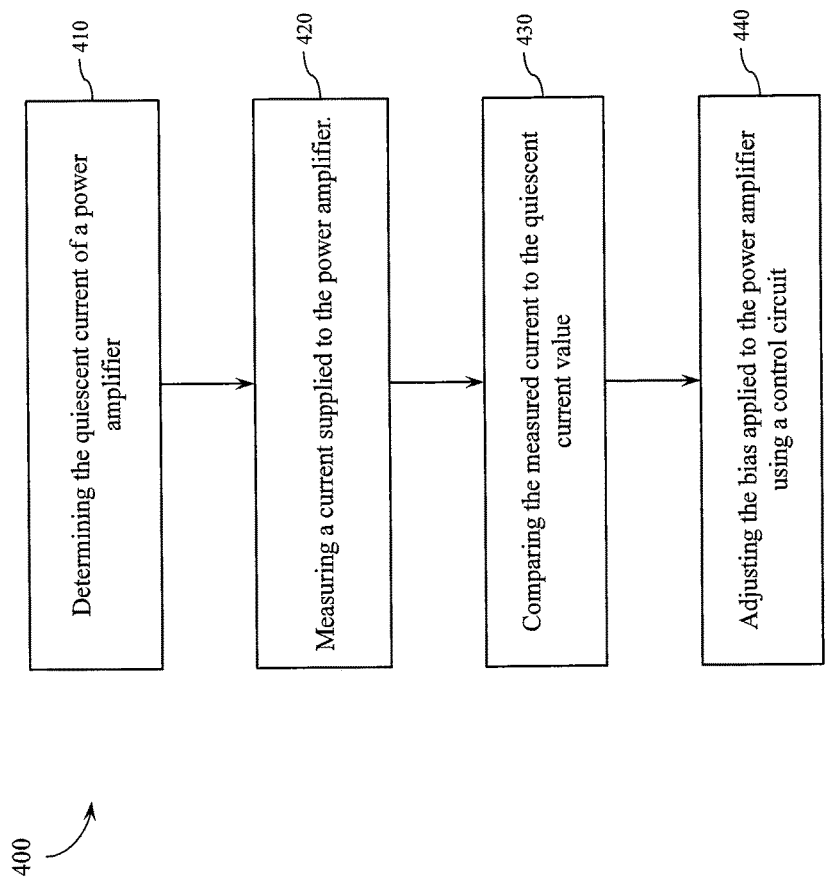
FIG. 6 is a flow diagram illustrating an operation of an automatic bias controller in accordance with an embodiment of the disclosure.

FIG. 6 is a flow diagram illustrating a process 400 for operating an automatic bias controller in accordance with an embodiment. In step 410, the quiescent current of a power amplifier is determined. In step 420, the current supplied to the power amplifier is measured. In one embodiment, measuring the current may include converting the measured current to a measured voltage using a current transformer. Next, in step 430, the measured current is compared to the quiescent current. In one embodiment, the comparison may include providing a reference signal matching the quiescent current, receiving the measured voltage and setting a logical signal to indicate whether the measured current is lower or higher than the quiescent current. In step 440, the bias signal applied to the power amplifier is adjusted using a control circuit. In one embodiment, the bias adjustment may include producing a pulse width modulated signal for supply to the power amplifier, adjusting the pulse width modulated signal based on the comparison, and timing a gate pulse provided to the power amplifier. In one embodiment, the pulse width modulated signal is adjusted between pulses and in time for use with a next pulse.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into substeps to provide features described herein.

Embodiments described above illustrate but do not limit the invention. It should also be understood that numerous modifications and variations are possible in accordance with the principles of the invention. Accordingly, the scope of the invention is defined only by the following claims.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
   a power amplifier characterized by an associated quiescent current value;
   a measurement circuit configured to measure a power supply current provided to the power amplifier, wherein the measurement circuit comprises a current transformer configured to convert the measured power supply current to a measured voltage;
   a comparison circuit configured to compare the measured power supply current to the quiescent current value; and
   a bias controller coupled to the comparison circuit, the bias controller configured to adjust a bias signal provided to the power amplifier based on the comparison, wherein the bias signal is adjusted between pulses for use with a next pulse.

2. The system of claim 1, wherein:
   the current transformer is coupled to a power amplifier supply configured to provide the power supply current to the power amplifier.

3. The system of claim 1, wherein the comparison circuit comprises:
   a reference signal generator configured to provide a reference signal corresponding to the quiescent current value; and
   a comparator coupled to the measurement circuit to receive the measured voltage, wherein the comparator is configured to output a logic signal (ID_LOW) indicating whether the measured voltage is less than the quiescent current value.

4. The system of claim 1, wherein the bias controller comprises:
   a pulse width modulator configured to produce a pulse width modulated signal (PA_PWM) and supply the PA_PWM to the power amplifier; and
   power amplifier drive control logic configured to adjust the PA_PWM based on an output of the comparison circuit.

5. The system of claim 4, wherein the power amplifier drive control logic is further configured to increment PA_PWM if ID_LOW is true, and decrement PA_PWM if ID_LOW is false.

6. The system of claim 1, wherein the bias controller comprises a field programmable gate array.

7. The system of claim 1, further comprising:
   a waveform generator configured to provide a pulsed waveform signal to the power amplifier; and
   a transmitter configured to transmit the amplified pulsed waveform signal.

8. The system of claim 7, wherein the transmitted pulsed waveform signal is comprises a remote sensor signal.

9. The system of claim 8, wherein the remote sensor signal comprises at least one of a radar signal or a sonar signal.

10. A method comprising:
    determining a quiescent current value of a power amplifier;
    measuring a power supply current supplied to the power amplifier by converting the power supply current to a measured voltage using a current transformer;
    comparing the measured current to the quiescent current value; and
    adjusting a bias of the power amplifier based on the comparison.

11. The method of claim 10, wherein adjusting the bias comprises:
    controlling the bias applied to the power amplifier using a control circuit for timing a gate pulse provided to the power amplifier.

12. The method of claim 10, wherein:
    the power supply current is provided by a power amplifier supply coupled to the current transformer and the power amplifier.

13. The method of claim 10, wherein comparing the measured current to the quiescent current value comprises:
    providing a reference signal corresponding to the quiescent current value;
    receiving the measured voltage; and
    setting a value of a logic signal (ID_LOW) to indicate whether the measured voltage is less than the quiescent current value.

14. The method of claim 10, wherein adjusting the bias comprises:

producing a pulse width modulated signal (PA_PWM) for supply to the power amplifier; and adjusting the PA_PWM based on the comparison.

15. The method of claim 14, wherein adjusting the PA_PWM comprises:

incrementing PA_PWM by one if ID_LOW is true; and decrementing PA_PWM by one if ID_LOW is false.

16. A system comprising:

a power amplifier characterized by an associated quiescent current value;

a measurement circuit configured to measure a power supply current provided to the power amplifier, wherein the measurement circuit comprises a current transformer configured to convert the measured power supply current to a measured voltage;

a comparison circuit configured to compare the measured power supply current to the quiescent current value;

digital circuitry coupled to the comparison circuit and configured to adjust a bias signal applied to the power amplifier using based on the output of the comparison circuit; and a gate control circuit configured to provide the bias signal to the power amplifier according to control signals provided by the digital circuitry.

17. The system of claim 16, wherein the digital circuitry comprises:

a pulse width modulator configured to produce a pulse width modulated signal (PA_PWM); and power amplifier drive control logic configured to adjust the PA_PWM based on an output of the comparison circuit;

wherein the PA_PWM is adjusted between pulses and in time for use with a next pulse.

18. The system of claim 17, wherein the power amplifier drive control logic is further configured to increment the PA_PWM by one if ID_LOW is true, and decrement the PA_PWM by one if ID_LOW is false.

19. The system of claim 17, wherein the digital circuitry further comprises:

a microcontroller for controlling the operation of the digital circuitry, including execution of the power amplifier drive control logic.

20. The system of claim 17, further comprising:

a low pass filter coupled to the digital circuitry and configured to receive the PA_PWM, wherein the gate control circuit comprises a power amplifier gate control circuit coupled to the output of the low pass filter and configured to provide a power amplifier gate drive signal to the power amplifier during a pulse.

* * * * *

UNITED STATES PATENT AND TRADEMARK OFFICE
CERTIFICATE OF CORRECTION

PATENT NO. : 10,454,425 B2
APPLICATION NO. : 15/913091
DATED : October 22, 2019
INVENTOR(S) : Richard Jales Page 1 of 1

It is certified that error appears in the above-identified patent and that said Letters Patent is hereby corrected as shown below:

In the Specification

In the Detailed Description:

In Column 8, Line 27, change "MS" to --AIS--.

In the Claims

In Claim 8, Column 24, Line 35, change "signal is comprises" to --signal comprises--.

In Claim 16, Column 25, Line 20, change "amplifier using based on" to --amplifier based on--.

Signed and Sealed this
Eleventh Day of February, 2020

Andrei Iancu
*Director of the United States Patent and Trademark Office*